(12) United States Patent
Kim

(10) Patent No.: US 11,972,707 B2
(45) Date of Patent: Apr. 30, 2024

(54) SOURCE DRIVER OF DISPLAY PANEL

(71) Applicant: Magnachip Semiconductor Ltd., Cheongju-si (KR)

(72) Inventor: Jonghyun Kim, Suwon-si (KR)

(73) Assignee: MagnaChip Semiconductor, Ltd., Cheongju-si (KR)

(*) Notice: Subject to any disclaimer, the term of this patent is extended or adjusted under 35 U.S.C. 154(b) by 0 days.

(21) Appl. No.: 18/110,624

(22) Filed: Feb. 16, 2023

(65) Prior Publication Data

US 2023/0298495 A1 Sep. 21, 2023

(30) Foreign Application Priority Data

Mar. 18, 2022 (KR) .................. 10-2022-0033982

(51) Int. Cl.
*G09G 3/00* (2006.01)
*G01R 27/02* (2006.01)

(52) U.S. Cl.
CPC .............. *G09G 3/006* (2013.01); *G01R 27/02* (2013.01); *G09G 2310/0275* (2013.01); *G09G 2310/0291* (2013.01); *G09G 2330/021* (2013.01); *G09G 2380/02* (2013.01)

(58) Field of Classification Search
CPC .... G09G 3/006; G09G 3/035; G09G 2380/02; G09G 2320/029; G09G 2320/0204; G09G 2310/0275; G09G 2330/021; G09G 2310/0291; G09G 2320/0233; G01R 27/02
See application file for complete search history.

(56) References Cited

U.S. PATENT DOCUMENTS

| | | | |
|---|---|---|---|
| 10,101,867 B2* | 10/2018 | Akimoto | G06F 3/04184 |
| 10,268,253 B2* | 4/2019 | Liu | G06F 1/1652 |
| 10,679,536 B2* | 6/2020 | Lee | G09G 3/3275 |
| 10,923,556 B2* | 2/2021 | Moon | H10K 59/131 |
| 10,937,387 B2* | 3/2021 | Okamoto | H10K 59/128 |
| 11,024,224 B2* | 6/2021 | Yildiz | G06F 1/3265 |
| 11,087,670 B2* | 8/2021 | Mandlik | G09G 3/3266 |
| 11,120,714 B2* | 9/2021 | Lee | G02F 1/136259 |
| 11,222,586 B2* | 1/2022 | Li | H10K 71/00 |
| 11,837,687 B2* | 12/2023 | Han | H01L 33/62 |
| 2018/0122302 A1* | 5/2018 | Koong | G09G 3/035 |
| 2019/0378456 A1* | 12/2019 | Choi | G02F 1/133305 |
| 2020/0073443 A1* | 3/2020 | Seo | G06F 3/0482 |
| 2022/0415260 A1* | 12/2022 | Jung | G09G 3/3266 |

* cited by examiner

*Primary Examiner* — Vinh T Lam
(74) *Attorney, Agent, or Firm* — NSIP Law

(57) ABSTRACT

A source driver for a display panel includes an output buffer configured to output a signal to a data line of the display panel; an output controller configured to control an output of the output buffer; a load resistance measuring unit configured to measure a load resistance of at least one data line of the display panel; and a comparison unit configured to compare the load resistance measured in the load resistance measuring unit with an initial load resistance, wherein the output controller is further configured to control a signal to be output by the output buffer based on the comparison result.

20 Claims, 7 Drawing Sheets

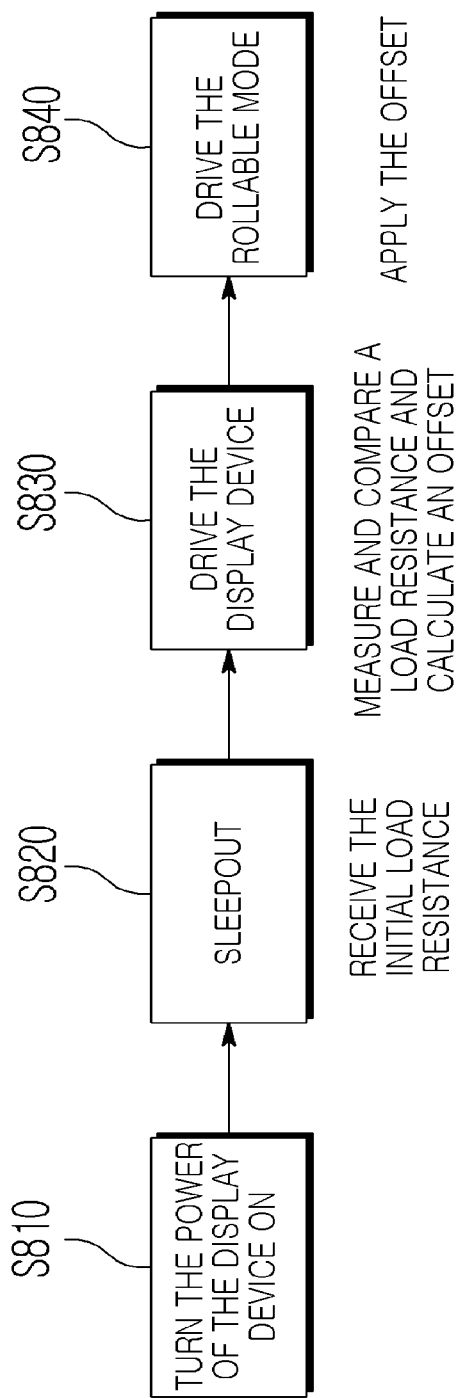

SOURCE DRIVER OF DISPLAY PANEL

CROSS REFERENCE TO RELATED APPLICATION

This application claims the benefit under 35 U.S.C. 119(a) of Korea Patent Application No. 10-2022-0033982 filed on Mar. 18, 2022, the entire disclosure of which is incorporated herein by reference for all purposes.

BACKGROUND

1. Field

The following description relates to a source driver for preventing display reliability deterioration that may occur in a rolling region of a display panel, particularly a rollable display panel, and a method therefor.

2. Description of the Related Art

Recently, rollable display panels have been commercialized mainly in large display devices, and rollable display panels are expected to be commercialized in small devices such as mobile phones in the future.

For small devices such as mobile phones, if a large rolling diameter is applied, the thickness of the product increases, which is disadvantageous in portability and aesthetics. For this reason, the rollable display panel of a small device is required to be designed to have a small rolling diameter in order to make the product thin and small.

A rolling region of the rollable display panel repeats rolling and unfolding due to its characteristics. In particular, when the rolling diameter is small, the rolling and unfolding may become larger. When these repetitive operations are accumulated, the physical properties of the rolling region may change, and thus the resistance of the panel may increase.

If a panel resistance in the rolling region increases, image quality deterioration may occur, or a difference in an image quality compared to another region, particularly to a non-rolling region, may occur. Further, this phenomenon is more likely to occur when a large stress is applied to the panel with a small rolling diameter, especially in a small device.

That is, a smaller rolling diameter in a small device may cause greater stress on the display panel, and may cause a decrease in display reliability such as image quality.

SUMMARY

This Summary is provided to introduce a selection of concept in a simplified form that are further described below in the Detailed Description. This Summary is not intended to identify key features or essential features of the claimed subject matter, nor is it intended to be used as an aid in determining the scope of the claimed subject matter.

In one general aspect, a source driver for a display panel includes: an output buffer configured to output a signal to a data line of the display panel; an output controller configured to control an output of the output buffer; a load resistance measuring unit configured to measure a load resistance of at least one data line of the display panel; and a comparison unit configured to compare the load resistance measured in the load resistance measuring unit with an initial load resistance, wherein the output controller is further configured to control a signal to be output by the output buffer based on a comparison result.

In another general aspect, a display device includes: a display panel configured to display an image; a storage module configured to store an initial load resistance of a data line of the display panel; and a source driver configured to compensate a signal to be output depending on a change in a load resistance of the display panel, wherein the display panel comprises a plurality of data lines and a load resistance measuring line for measuring at least some of the plurality of data lines, wherein the source driver comprises: an output buffer configured to output a signal to the plurality of data lines; an output controller configured to control an output of the output buffer; a load resistance measuring unit configured to measure a load resistance of the at least some of the plurality of data lines through the load resistance measuring unit; and a comparison unit configured to compare the load resistance measured in the load resistance measuring unit with an initial load resistance; and wherein the output controller is further configured to control a signal to be output by the output buffer to the at least some of the plurality of data lines based on a comparison result.

In another general aspect, a method of operating a source driver to compensate a signal to be output to a data line according to a change in a load resistance of a display panel includes: measuring a load resistance of at least one data line of the display panel; comparing the measured load resistance with an initial load resistance; and controlling the signal to be output to the data line based on a comparison result.

Advantageous Effects

According to various embodiments of the present disclosure, an output signal can be compensated by increasing an output of an output buffer when a load resistance of a display panel is increased. In some embodiments, it is possible to measure and compensate a load resistance per data line respectively.

By compensating a signal to be outputted to the display panel from the output buffer, it can be reduced the image quality deviation per region of the display device. In particular, the embodiments may solve a problem of a declined image quality due to an increased load resistance that arises as a result of repeated rolling in a rollable display panel.

Advantageous effects available to achieve from the present disclosure are not limited to the above-mentioned effects and other advantageous effects not mentioned may be precisely understood from the description below by those skilled in the art.

Other features and aspects will be apparent from the following detailed description, the drawings, and the claims.

BRIEF DESCRIPTION OF DRAWINGS

FIG. 7 is a schematic diagram illustrating operation per driving time point of a display device according to one or more embodiments of the present disclosure.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
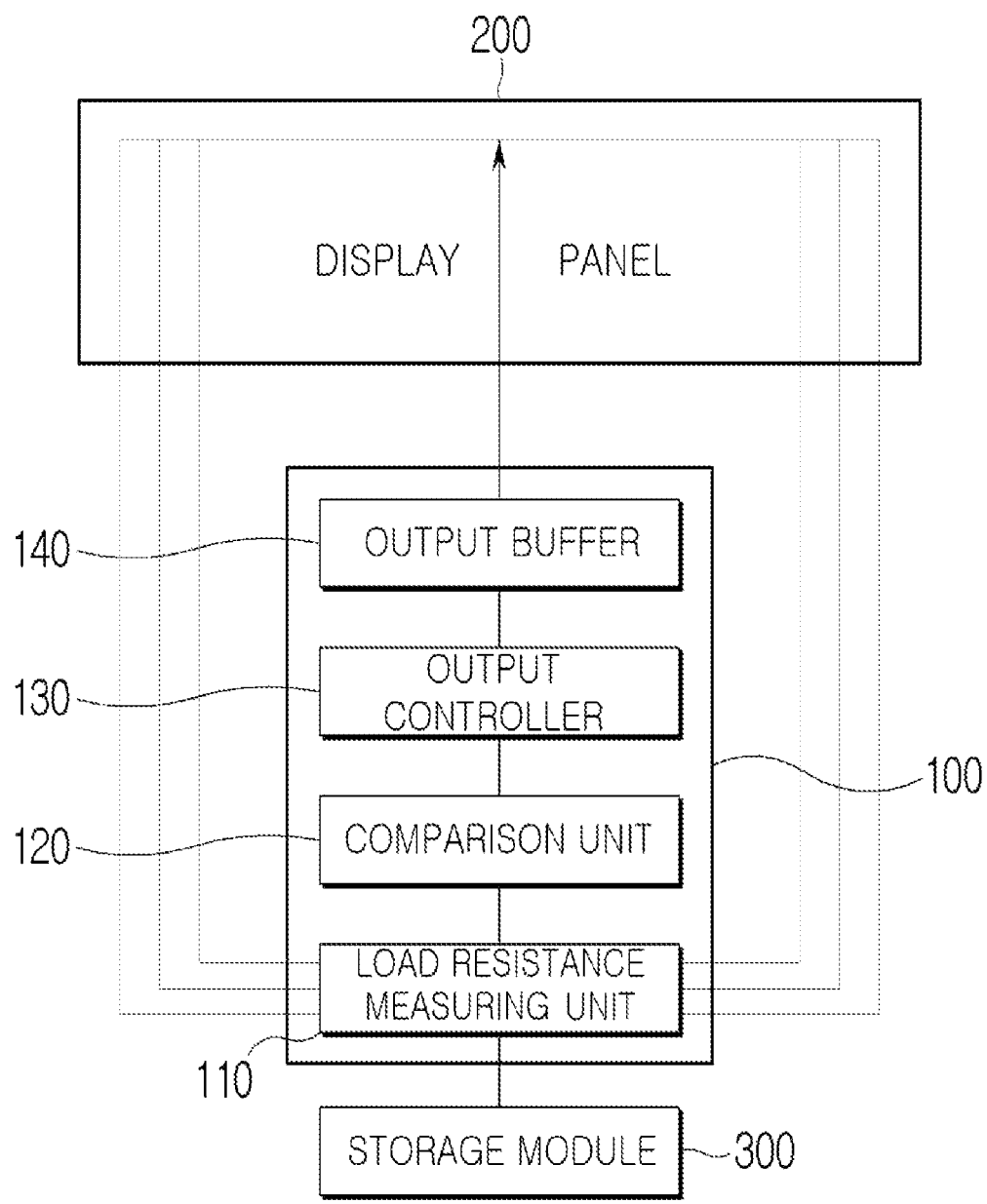
FIG. 1 is a schematic diagram illustrating configuration of a source driver according to one or more embodiments of the present disclosure.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a schematic diagram illustrating configuration of a source driver according to one or more embodiments of the present disclosure.

The source driver 100 may make a display panel 200 display an image according to inputted image information by outputting signals to data lines of the display panel 200. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

In particular, the source driver 100 according to various embodiments of the present disclosure may have a configuration capable of compensating a signal outputted according to a change in a load resistance of the display panel 200.

According to various embodiments of the present disclosure, the source driver 100 may include a load resistance measuring unit 110, a comparison unit 120, an output controller 130 and an output buffer 140.

The output buffer 140 may output a signal to a data line of the display panel 200. For example, the output buffer 140 may include an operational amplifier.

The output controller 130 may control an output of the output buffer 140. The output controller 130 may control a current signal or a voltage signal outputted by the output buffer 140. The output controller 130 may control a signal outputted by the output buffer 140 based on information received from the comparison unit 120.

The load resistance measuring unit 110 may measure a load resistance of the display panel 200. The load resistance measuring unit 110 may measure a load resistance of a portion of the display panel 200. For example, the load resistance measuring unit 110 may measure a load resistance of a certain data line of the display panel 200. Also, the load resistance measuring unit 110 may transmit information of the measured load resistance to the comparison unit 120.

According to various embodiments of the present disclosure, the load resistance measuring unit 110 may be electrically connected with the load resistance measuring line to measure a load resistance. In the display panel 200, the data lines and the load resistance measuring lines to measure a load resistance of each data line may be disposed separately. Here, the load resistance measuring lines may be connected to the entire data lines or some of the plurality of the data lines.

For example, when the data lines are composed of a data line 1 to a data line 1080, the load resistance measuring line may be disposed on a data line 1, a data line 101, a data line 201, . . . , and a data line 1001. The load resistance measuring unit 110 may be configured to measure load resistances of the data lines by electrically connecting the load resistance measuring lines with the data lines.

A storage module 300 may store information such as numbers of the data lines to which the load resistance measuring lines are connected and numbers of the load resistance measuring lines, and the like.

The comparison unit 120 may compare a load resistance measured by the load resistance measuring unit 110 with the initial load resistance. The comparison unit 120 may include a processor to process information, and perform computational processing and the like by comparing a measured load resistance with the initial load resistance.

The initial load resistance may be received from the storage module 300. The storage module 300 may be disposed outside the source driver 100, but is not limited thereto. Here, the storage module 300 is a configuration for storing data, and may include a flash memory, an erasable programmable read-only memory (EPROM), a one-time programmable (OTP), and the like.

Figure 2A:
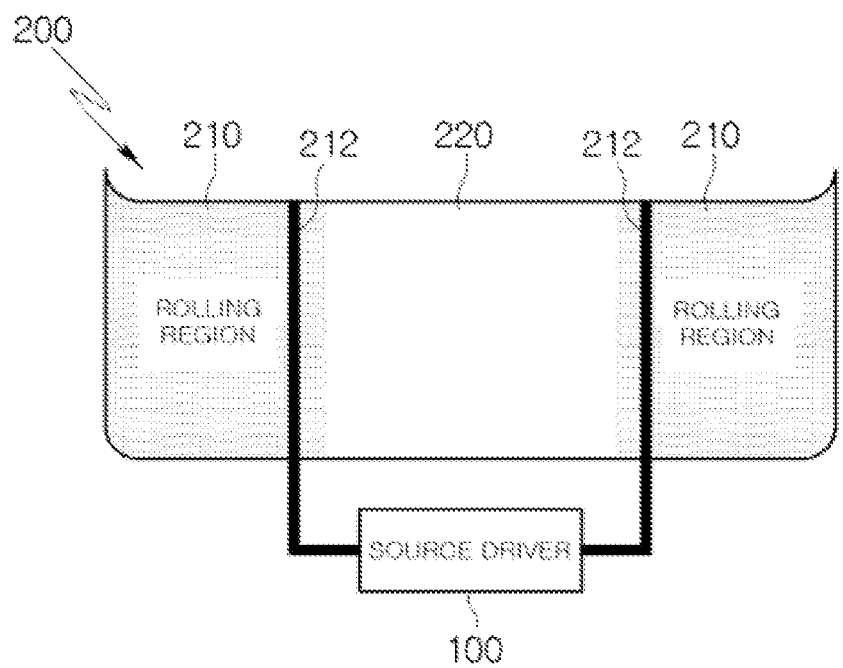
FIGS. 2A and 2B are schematic diagrams illustrating operation of a source driver according to one or more embodiments of the present disclosure.
Figure 2B:
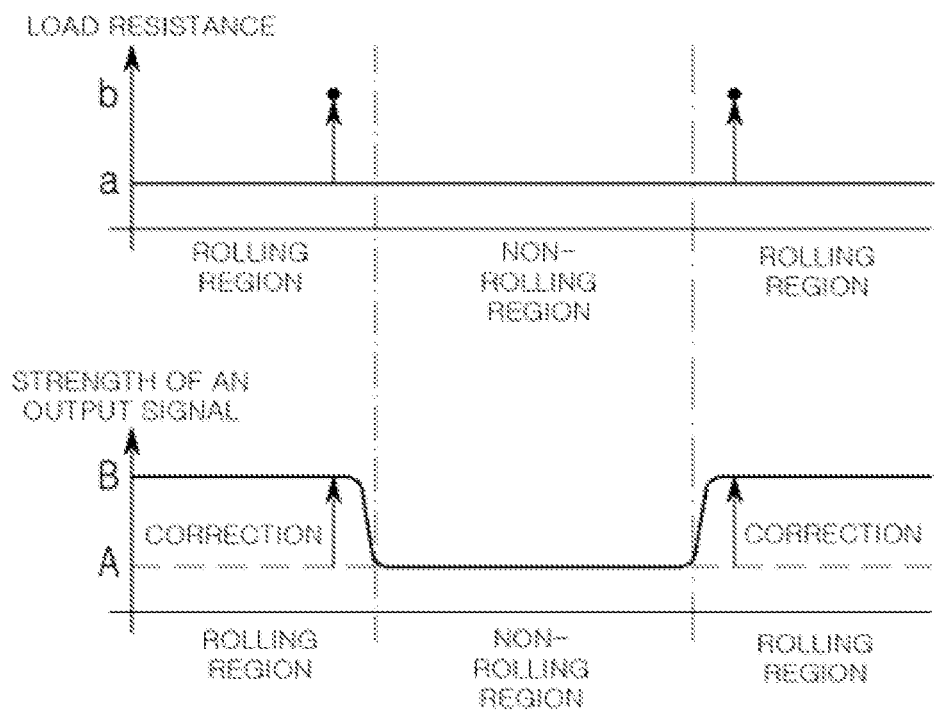
Figure 3:
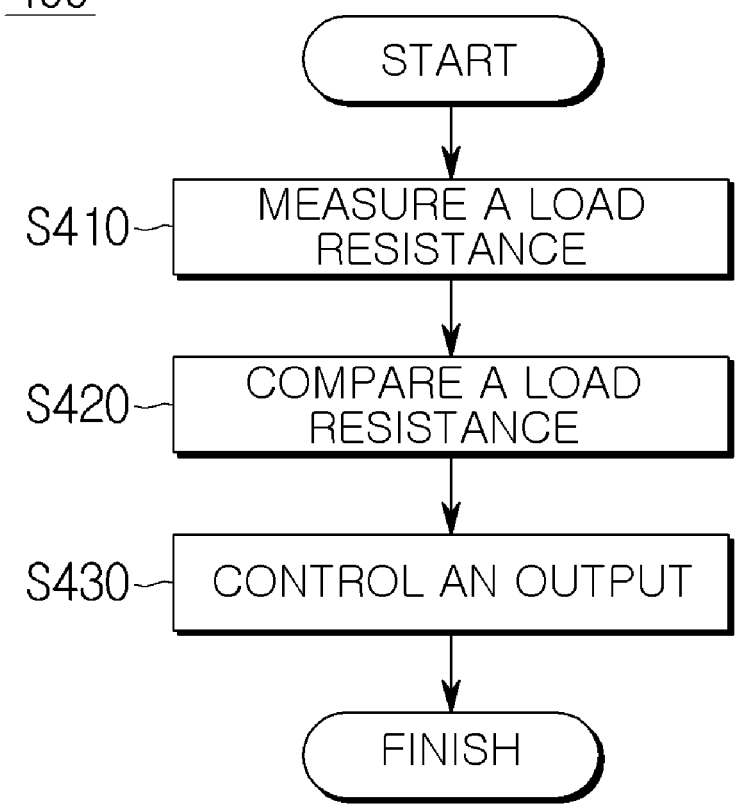
FIG. 3 is a flowchart illustrating a method of operating a source driver for compensating a signal to be outputted according to a change in a load resistance of a display panel according to one or more embodiments of the present disclosure.

Referring to FIGS. 2 and 3, an operation of the source driver according to one or more embodiments of the present disclosure will be described.

FIGS. 2A and 2B are schematic diagrams illustrating an operation of a source driver according to an embodiment of the present disclosure.

Referring to FIG. 2A, the display panel 200 may include a rolling region 210 capable of rolling and a non-rolling region 220. In the rolling region 210, the load resistance measuring line 212 for measuring a load resistance of the data line may be disposed. In FIG. 2A, the load resistance measuring line 212 is shown to be disposed across the rolling regions 210, and the illustration may indicate that load resistance measurement is possible through an electrical connection between the load resistance measuring line 212 and the data line.

The source driver 100 may measure a load resistance of a specific data line in the rolling region 210 through the load resistance measuring line 212. As shown in FIG. 2B, when a difference occurs between the load resistance of the non-rolling region 220 and the load resistance of the rolling region 210 due to a change in the load resistance of the data line in the rolling region 210, the strength of the output signal may be corrected by updating the offset to suit the degree of the change. The corrected strength of the output signal is illustrated in FIG. 2B.

Referring to FIG. 3, a method of operating a source driver for compensating a signal to be outputted according to a change in a load resistance according to one or more embodiments of the present disclosure will be explained in more detail.

According to one or more embodiments of the present disclosure, a method of operating a source driver 100 to compensate a signal to be outputted to the data line according to a change in a load resistance of the display panel 200 may include measuring a load resistance of at least one data line of the display panel 200 by the load resistance measuring unit 110 (S410), comparing the measured load resistance with the initial load resistance by the comparison unit 120 (S420), and controlling a signal to be outputted to the data line by the output controller 130 based on the comparison result (S430).

In operation S410, the load resistance measuring unit 110 (or, the source driver 100) may perform measurement of a load resistance of at least one data line.

The load resistance measuring unit 110 may output a predetermined voltage (Vi) by controlling the output buffer 140 connected to the data line to be measured. Further, the load resistance measuring unit 110 may measure a voltage (Vf) and a current (I) at the end of the data line through the load resistance measuring line 212 connected to an end of the corresponding data line. The voltage (Vf) at the end of the data line may differ from the predetermined voltage (Vi) outputted through the output buffer due to a voltage drop caused by a resistance (R) present in the data line. In other words, the resistance (R) of the corresponding data line may be calculated as $R=(Vi-Vf)/I$.

The comparison unit 120 may perform comparing a load resistance measured by the load resistance measuring unit 110 with the initial load resistance (S420). Here, the comparison unit 120 may receive a load resistance from the load resistance measuring unit and obtain the initial load resistance from the storage module 300. FIG. 2B shows an increase in the measured load resistance compared with the initial load resistance.

The output controller 130 may perform controlling a signal to be outputted to the data line based on the comparison result (S430). The output controller 130 may control a current signal or a voltage signal output from the output buffer 140 to the data line. FIG. 2B shows that the strength of the output signal is changed from A to B according to a change in the load resistance. Changing the strength of the signal may be done by updating an offset. FIG. 2B shows an example where the source driver estimates that a load resistance of the rolling region having a regular curvature ratio is uniformly changed throughout the rolling region, and applies a new offset consistently to the rolling region.

Figure 4:
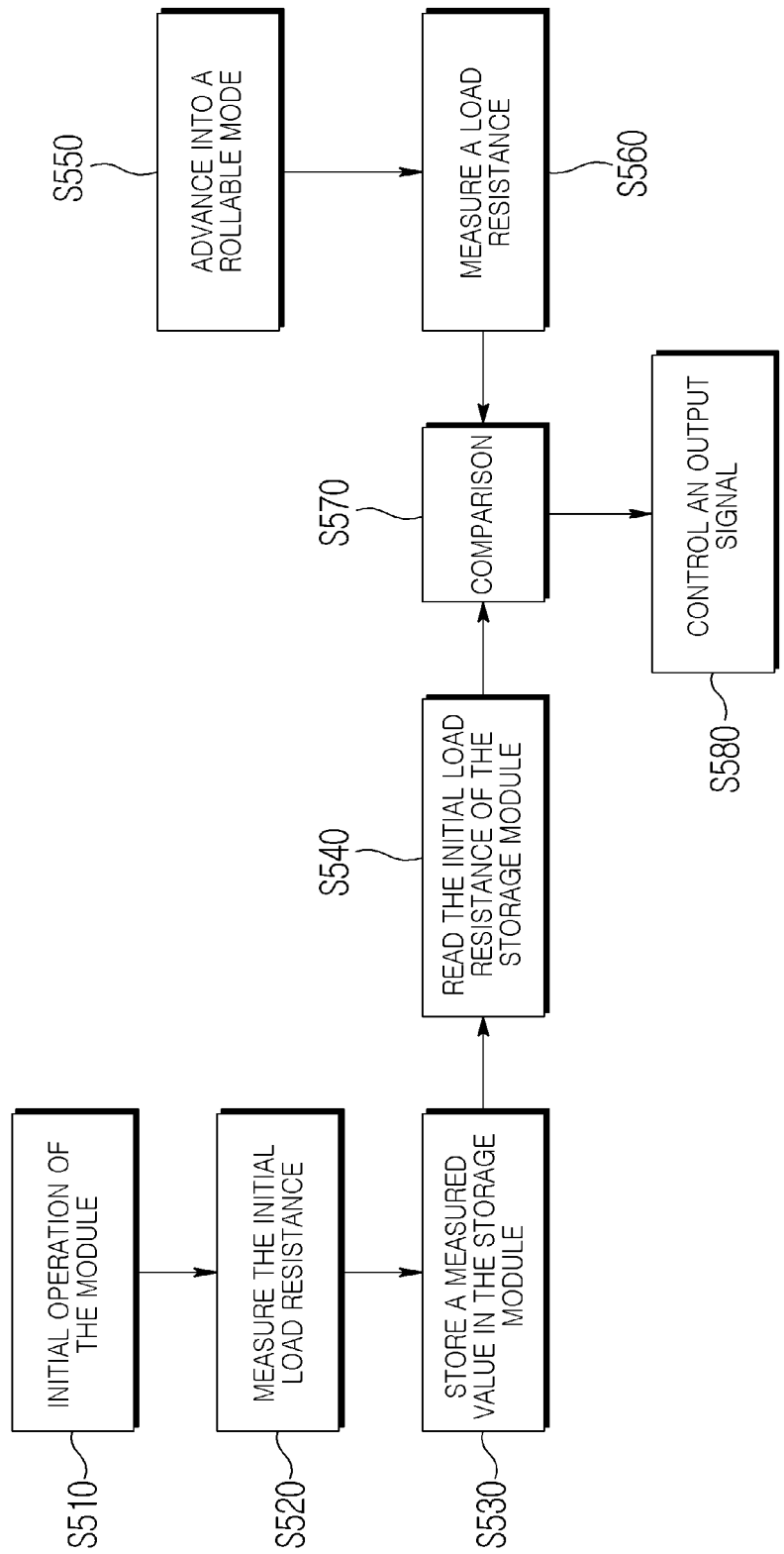
FIG. 4 is a schematic diagram illustrating operation of a display device according to one or more embodiments of the present disclosure.

FIG. 4 is a schematic diagram illustrating an operation of a display device according to one or more embodiments of the present disclosure. The display device may measure the initial load resistance of the data line (S520) at a time of the initial driving after an assembly (S510), and store the initial load resistance in the storage module 300 (S530).

The display device may read the initial load resistance of the storage module 300 (S540), measure a load resistance (S560), compare the measured load resistance with the initial load resistance (S570), and determine whether an offset update is required. If the measured load resistance is noticeably changed as shown in FIG. 2B, the display device may determine that the offset needs to be updated.

In addition, the display device may control the signal to be outputted to the data line accordingly. Though measuring a load resistance (S560) is illustrated as being performed at a time point to advance into a rollable mode (S550) in FIG. 4, measuring the load resistance (S560) may be performed when power is applied to the display device or when the display panel starts driving after power is applied to the display device.

According to one or more embodiments of the present disclosure, the comparison unit 120 may calculate how many times the load resistance received from the load resistance measuring unit 110 is greater than the initial load resistance, transmit the comparison result to the output controller 130, and make the output controller 130 compensate the output signal based on the comparison result.

According to another embodiment, the comparison unit 120 may be configured to determine whether a specific condition is satisfied through comparison. For example, the comparison unit 120 may determine whether the measured load resistance exceeds 20% of the initial load resistance.

Next, a third step may be performed, in which the output controller 130 controls the output of the output buffer 140 based on the comparison result obtained by the previous comparison (S430). The output buffer may output a signal to the data line according to the control of the output controller 130.

Controlling the output of the output buffer by the output controller 130 may represent increasing a current input to the output buffer 140 to increase a slew rate of the output buffer. Alternatively, when the output controller 130 controls the output of the output buffer, it may mean increasing the strength of a signal output from the output buffer 140.

The load resistance of the display panel may increase due to repeated rolling and the like. If the load resistance of the data line of the display panel increases, a source voltage outputted by the output buffer may have a smaller slew rate and accordingly, a normal voltage may not be sufficiently supplied to the data line in a certain period of time. In this case, if the same signal is provided without any compensation, the output image of the rolling region may be different or delayed from the output image of the non-rolling region.

In addition, due to the load resistance, when the output buffer provides the same output strength, a difference in displayed images in terms of luminance and the like may occur because a small current signal flows in the data line with higher load resistance.

According to one or more embodiments of the present disclosure, if the load resistance increases when the load resistance of the data line of the display panel is monitored, it is possible to compensate the output signal by increasing the strength of the output signal of the output buffer that drives the corresponding data line.

By compensating the signal to be outputted to the display panel, it is possible to eliminate deviation in the image quality per region of the display device that arises by a difference in the load resistance. Such method may solve a problem of the image quality deterioration due to the increased load resistance caused by repeated rolling of the rollable display panel.

Figure 5:
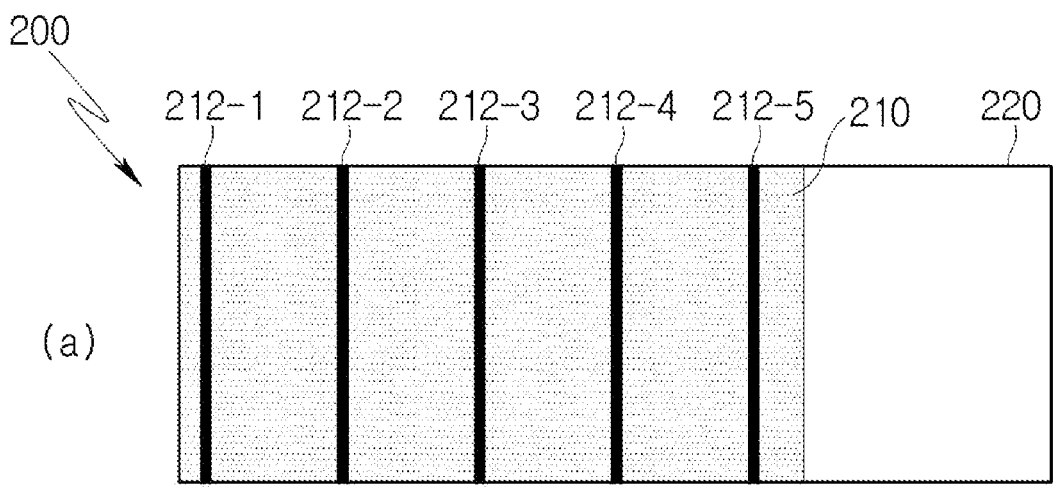
FIG. 5 is a schematic diagram illustrating a method of operating a source driver for compensating a signal based on a plurality of load resistance measuring lines according to one or more embodiments of the present disclosure.
Figure 5:
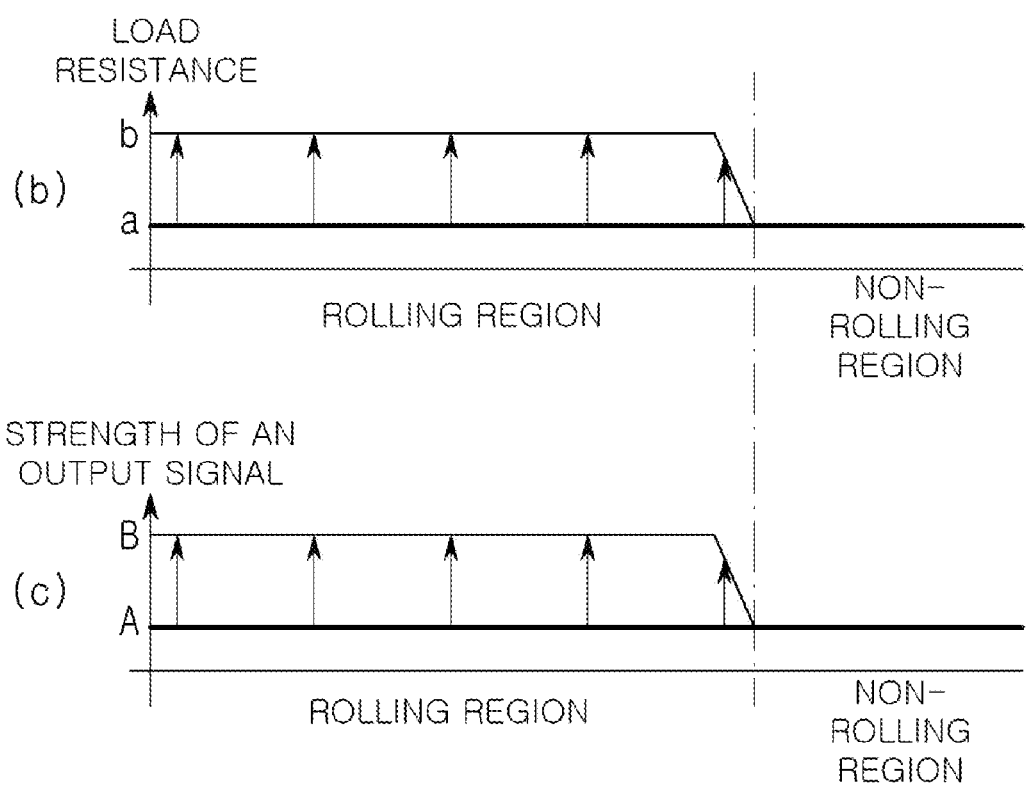
Figure 6:
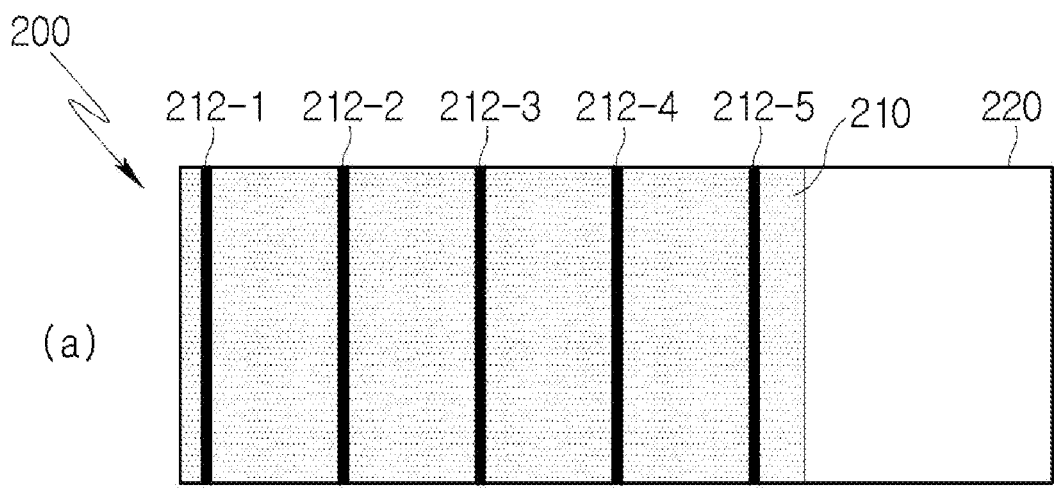
FIG. 6 is a schematic diagram illustrating an example of compensating a signal by a source driver based on a plurality of load resistance measuring lines if a load resistance is irregular according to one or more embodiments of the present disclosure.
Figure 6:
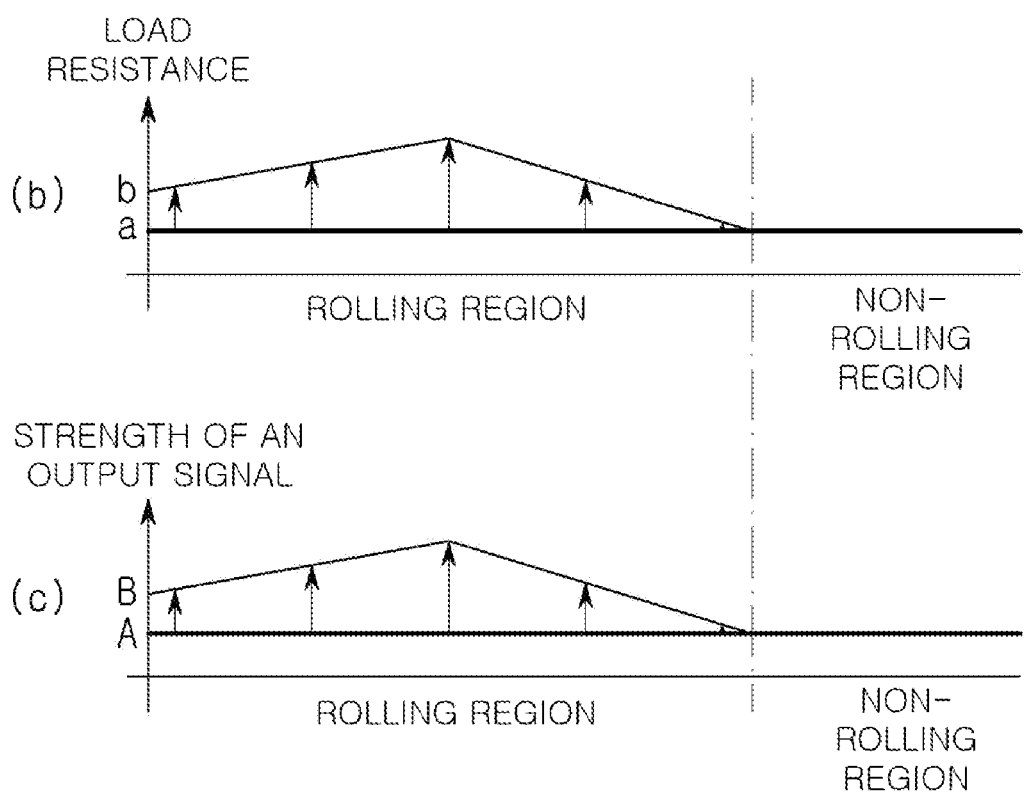

FIGS. 5 and 6 are schematic diagrams illustrating examples of a source driver configured to compensate a signal based on a plurality of load resistance measuring lines according to one or more embodiments of the present disclosure.

The source driver 100 may adjust the strength of an output signal per each data line whose load resistance is measured according to the load resistance. The display panel may include a plurality of data lines. The load resistance measuring lines may be provided to at least some of the data lines of the plurality of data lines. The source driver 100 may have respective output buffers for supplying signals to each data line, and may compensate and control signals to be outputted to the data lines individually by controlling the respective output buffers.

FIG. 5 shows an illustration where the load resistance measuring lines 212-1, 212-2, 212-3, 212-4, and 212-5 are disposed to some of the data lines of the plurality of the data lines (not illustrated) arranged in the rolling region 210. The source driver may measure the load resistance of the data lines to which the load resistance measuring lines 212-1, 212-2, 212-3, 212-4 and 212-5 are respectively connected and may compensate the output signals per data line according to a degree of change in the load resistance.

In (b) and (c) of FIG. 5, the arrows show the degree of a change in the load resistance or the strength of the output signal. As illustrated, since the load resistance is changed to 'b' from 'a' which is the initial load resistance, it is possible to update the strength of the output signal from the initial output signal A to B.

In addition, the source driver 100 may perform interpolation with respect to the data lines from which the load resistance is not measured based on the value of the adjacent data line. For example, the source driver 100 may control the signal output of the output buffer so that at least one data line disposed between a first data line and a second data line is interpolated based on a load resistance of the first data line and a load resistance of the second data line.

The source driver 100 may estimate the load resistance of the data line to which the load resistance measuring line is not disposed, based on the load resistance of the adjacent data line from which the load resistance can be measured, and may control the strength of the output signal of the data line to which the load resistance measuring line is not disposed based on the estimation.

For example, if the load resistance measuring line is provided to a data line 1, 101, 201, . . . and a data line 1001 and the load resistance thereof is measured, the signal of the data line 151 may be estimated to be a mean value between the load resistance of the data line 101 and the load resistance of the data line 201, and an offset with respect to the data line 151 may be calculated based on the estimated load resistance value, and the output signal to the data line 151 may be adjusted accordingly. Here, it is easy to perform interpolation linearly, but it is also possible to perform interpolation through a non-linear equation.

A method by the source driver 100 for controlling the output with the interpolated output for the data lines for which the load resistance is not measured may be performed by directly calculating the interpolated offset based on the offset of the adjacent data lines.

More particularly, if the offset is determined based on the load resistance measured in the adjacent data lines where the load resistance measurement is possible, the offset of the data line to which the load resistance measuring line is not disposed may be calculated based on the determined offset of the adjacent data lines where the load resistance measurement is possible. For example, the offset value of the data line to which the load resistance measuring line is not disposed may be calculated based on a mean value of the offset value of the adjacent data lines.

FIG. 6 is a schematic diagram illustrating an example of compensating a signal by a source driver based on a plurality of load resistance measuring lines if a load resistance is irregular according to an embodiment of the present disclosure.

In this case, the data line from which the load resistance is measured may compensate the output signal according to the measured load resistance. In addition, the data line therebetween may compensate the output signal through the linear interpolation.

FIG. 7 is a schematic diagram illustrating an operation per driving time point of a display device according to one or more embodiments of the present disclosure.

The source driver 100 may perform receiving information from the storage module at a time point of a sleep-out (S820) after power of the display device is turned on (S810). More specifically, the source driver 100 may receive an initial load resistance stored in a flash memory or the like. The time point of a sleep-out (S820) is a time point when the display panel exits from a sleep-mode, and refers to a short section (black section) in which the display panel does not display data before the display device is fully driven.

At a time point when the display panel is driven (S830), the source driver may be driven as well, and the source driver 100 may measure the load resistance of the data lines and compare the measured load resistance thereof with the initial load resistance at the respective time point, and may calculate the offset based on the comparison result if there is any change in the load resistance. Since the display panel in the rolling region does not operate at this time point, the source driver may calculate the offset at this time point, however the offset may not be applied yet.

When the rollable mode is driven (S840) and an image is displayed in the rolling region, it may be possible to compensate image quality in the rolling region by adjusting an output signal per data line of the display panel by applying a calculated offset.

The operations per time point as explained above are examples and it is possible to configure the display panel differently so as to operate at different time points.

According to one or more embodiments, operations of measurement, comparison and compensation control of the load resistance of the data line of the display panel may be configured to be performed whenever operations of driving and an image output of the display panel as explained previously is proceeded after the display device is powered on. The time points of the explained operations are taken as examples of an embodiment, and the time points of receiving the initial load resistance, comparison and the offset calculation may be configured variously.

According to one or more embodiments of the present disclosure, the storage module 300 may include a memory capable of writing, and the storage module 300 may store the output value (offset) calculated by the output controller 130 and/or the load resistance measured by the load resistance measuring unit 110.

If configured in this way, it is possible to configure the storage module 300 to operate with the offset newly stored in the storage module without a need to perform the operations of measuring, comparing and controlling the load resistance whenever the power of the display panel is turned on, and to configure the comparison unit 120 to determine whether the offset needs to be updated or not. In this instance, storing the measured load resistance in the storage module 300 may be performed by the output controller 130 or through the comparison unit 120.

The change in the load resistance of the rollable display panel may occur continuously, but may also change discontinuously according to a large change over time. For example, an update may be required whenever a change above a user-set threshold occurs. Therefore, instead of performing measurement and updating whenever the power unit is turned on, it may be possible to perform updating whenever the load resistance meets a certain condition and to store the value.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A source driver for a display panel, comprising:
an output buffer configured to output a signal to a data line of the display panel;
an output controller configured to control an output of the output buffer;
a load resistance measuring unit configured to measure a load resistance of at least one data line of the display panel; and
a comparison unit configured to compare the load resistance measured in the load resistance measuring unit with an initial load resistance,
wherein the display panel comprises a plurality of data lines and a load resistance measuring line disposed on some of the plurality of data lines, and
wherein the output controller is further configured to control a signal to be output by the output buffer based on a comparison result.

2. The source driver of claim 1, wherein the load resistance measuring unit is configured to measure a first load resistance of a first data line and a second load resistance of a second data line of the display panel,
wherein the output buffer comprises a first output buffer configured to output a first signal to the first data line, and a second output buffer configured to output a second signal to the second data line,
wherein the comparison unit is configured to compare the first load resistance of the first data line and the second load resistance of the second data line with the initial load resistance, respectively, and
wherein the output controller is configured to control:
the first output buffer based on a result of comparing the first load resistance of the first data line with the initial load resistance, and
the second output buffer based on a result of comparing the second load resistance of the second data line with the initial load resistance.

3. The source driver of claim 2, wherein the output controller is configured to control a signal to be output by the output buffer to at least one data line disposed between the first data line and the second data line as an interpolated output based on the first load resistance of the first data line and the second load resistance of the second data line.

4. The source driver of claim 1, wherein the load resistance measuring unit is configured to measure the load resistance of the at least one data line of the display panel at a time point when the display panel is driven.

5. The source driver of claim 2, wherein the output controller is configured to:
increase a strength of a signal to be output by the first output buffer when the first load resistance of the first data line increases higher than the initial load resistance, and
increase a strength of a signal to be output by the second output buffer when the second load resistance of the second data line increases higher than the initial load resistance.

6. The source driver of claim 1, wherein the display panel comprises a rolling region and a non-rolling region, and
wherein the load resistance measuring unit is configured to measure a load resistance of a data line disposed in the rolling region.

7. A display device, comprising:
a display panel configured to display an image;
a storage module configured to store an initial load resistance of a data line of the display panel; and
a source driver configured to compensate a signal to be output according to a change in a load resistance of the display panel,
wherein the display panel comprises a plurality of data lines and a load resistance measuring line disposed on some of the plurality of data lines,
wherein the source driver comprises:
an output buffer configured to output a signal to the plurality of data lines;
an output controller configured to control an output of the output buffer;
a load resistance measuring unit configured to measure a load resistance of the at least some of the plurality of data lines through the load resistance measuring lines; and
a comparison unit configured to receive the initial load resistance of the at least some of the plurality of data lines from the storage module and compare a load resistance measured by the load resistance measuring unit with the initial load resistance, and
wherein the output controller is further configured to control a signal to be output by the output buffer to the at least some of the plurality of data lines based on a comparison result.

8. The display device of claim 7, wherein the plurality of data lines comprise a first data line and a second data line, and the load resistance measuring unit is configured to measure a first load resistance of the first data line and a second load resistance of the second data line,
wherein the output buffer comprises a first output buffer configured to output a first signal to the first data line, and a second output buffer configured to output a second signal to the second data line,
wherein the comparison unit is configured to compare a first load resistance of the first data line and a second load resistance of the second data line with the initial load resistance, respectively, and
wherein the output controller is configured to control:
the first output buffer based on a result of comparing the first load resistance of the first data line with the initial load resistance; and
the second output buffer based on a result of comparing the second load resistance of the second data line with the initial load resistance.

9. The display device of claim 8, wherein with regard to controlling a signal to be output by the output buffer to at least one data line disposed between the first data line and the second data line, the output controller is configured to control the signal output as an interpolated output based on an output to the first data line and an output to the second data line.

10. The display device of claim 7, wherein the load resistance measuring unit is configured to measure a load resistance of at least one data line of the display panel at a time point when the display panel is driven.

11. The display device of claim 7, wherein the storage module is configured to store information such as numbers of the plurality of data lines to which load resistance measuring lines are connected and numbers of the load resistance measuring lines.

12. The display device of claim 11, wherein the storage module is configured as a flash memory or an EPROM.

13. The display device of claim 8, wherein the output controller is configured to:
increase a strength of a signal to be output by the first output buffer when the first load resistance of the first data line increases higher than the initial load resistance, and
increase a strength of a signal to be output by the second output buffer when the second load resistance of the second data line increases higher than the initial load resistance.

14. The display device of claim 7, wherein the display panel comprises a rolling region and a non-rolling region, and
wherein the load resistance measuring line is disposed in the rolling region.

15. A method of operating a source driver to compensate a signal to be output to a data line according to a change in a load resistance of a display panel, the method comprising:
measuring a load resistance of at least one data line of the display panel;
comparing the measured load resistance with an initial load resistance; and
controlling the signal to be output to the data line based on a comparison result,
wherein the display panel comprises a plurality of data lines and a load resistance measuring line disposed on some of the plurality of data lines.

16. The method of claim 15, wherein the measuring of the load resistance comprises measuring a first load resistance of a first data line and a second load resistance of a second data line of the display panel,
wherein the comparing of the measured load resistance comprises comparing the first load resistance of the first data line and the second load resistance of the second data line with the initial load resistance, respectively, and
wherein the controlling of the signal comprises:
controlling a first signal to be output to the first data line based on a result of comparing the first load resistance of the first data line with the initial load resistance; and
controlling a second signal to be output to the second data line based on a result of comparing the second load resistance of the second data line with the initial load resistance.

17. The method of claim 16, wherein the controlling of the signal comprises controlling a signal to be output to at least one data line disposed between the first data line and the second data line as an interpolated signal based on the signal to be output to the first data line and the signal to be output to the second data line.

18. The method of claim 15, wherein the measuring of the load resistance is performed at a time point when the display panel is driven.

19. The method of claim 15, further comprising:
 storing the measured load resistance,
 wherein the controlling of the signal is performed when it is determined that a signal to be output to the data line is changed in the load resistance comparison step.

20. The method of claim 15, wherein the controlling of the signal is performed when the source driver outputs a signal to a rolling region of the display panel.

* * * * *